(12) United States Patent
Andreev et al.

(10) Patent No.: US 8,735,857 B2
(45) Date of Patent: May 27, 2014

(54) VIA-CONFIGURABLE HIGH-PERFORMANCE LOGIC BLOCK ARCHITECTURE

(75) Inventors: Alexander Andreev, San Jose, CA (US); Sergey Gribok, Santa Clara, CA (US); Ranko Scepanovic, Saratoga, CA (US)

(73) Assignee: eASIC Corporation, Santa Clara, CA (US)

( * ) Notice: Subject to any disclaimer, the term of this patent is extended or adjusted under 35 U.S.C. 154(b) by 300 days.

(21) Appl. No.: 13/271,679

(22) Filed: Oct. 12, 2011

(65) Prior Publication Data

US 2012/0161093 A1 Jun. 28, 2012

Related U.S. Application Data

(60) Provisional application No. 61/426,176, filed on Dec. 22, 2010.

(51) Int. Cl.
*H01L 27/08* (2006.01)
*H01L 47/00* (2006.01)

(52) U.S. Cl.
USPC .................. 257/2; 257/202; 257/415; 326/41

(58) Field of Classification Search
USPC .................. 257/369, 401, E27.011, E27.062, 257/E23.151, 2, 415, 209, E47.001, 257/E29.324; 977/734
See application file for complete search history.

(56) References Cited

U.S. PATENT DOCUMENTS

| | | | |
|---|---|---|---|
| 5,804,986 A | 9/1998 | Jones | |
| 6,097,221 A | 8/2000 | Sako | |
| 6,194,914 B1 | 2/2001 | Sako | |
| 6,441,642 B1 | 8/2002 | Jones et al. | |
| 6,466,051 B1 | 10/2002 | Jones et al. | |
| 6,897,543 B1 | 5/2005 | Huang et al. | |
| 7,797,610 B1 | 9/2010 | Simkins | |
| 7,956,421 B2 * | 6/2011 | Becker | 257/369 |
| 7,960,242 B2 * | 6/2011 | Or-Bach et al. | 438/401 |
| 8,058,691 B2 * | 11/2011 | Becker | 257/369 |
| 2004/0159892 A1 | 8/2004 | Takizawa | |
| 2005/0104621 A1 | 5/2005 | Kawahara et al. | |
| 2006/0033124 A1 * | 2/2006 | Or-Bach et al. | 257/202 |
| 2009/0278229 A1 | 11/2009 | Yang et al. | |
| 2010/0134141 A1 | 6/2010 | Bertin et al. | |
| 2010/0259296 A1 | 10/2010 | Or-Bach | |

OTHER PUBLICATIONS

F. Mo and R. Brayton, "PLA-Based Regular Structures and Their Synthesis," IEEE Trans. on Comp.-Aided Design of Int. Circ. and Syst., vol. 22, No. 6, Jun. 2003.
M.-C. Li et al , "Standard Cell Link Via-Configurable Logic Block for Structured ASICs," IEEE Computer Soc. Ann. Symp. on VLSI, 2008.
Y. Ran and M. Marek-Sadowska, "The Magic of a Via-Configurable Regular Fabric," IEEE Intl. Conf. on Computer Design: VLSI in Computers and Processors, 2004.
International Search Report and Written Opinion issued in PCT/US11/66457 mailed May 2, 2012.
International Preliminary Report on Patentability and Written Opinion issued in PCT/US11/66457 date of issuance Jun. 25, 2013.

* cited by examiner

*Primary Examiner* — Vibol Tan
(74) *Attorney, Agent, or Firm* — Novak Druce Connolly Bove + Quigg LLP

(57) ABSTRACT

A via-configurable circuit block may contain chains of p-type and n-type transistors that may or may not be interconnected by means of configurable vias. Configurable vias may also be used to connect various transistor terminals to a ground line, a power line and/or to various terminals that may provide connections outside of the circuit block.

14 Claims, 5 Drawing Sheets

VIA-CONFIGURABLE HIGH-PERFORMANCE LOGIC BLOCK ARCHITECTURE

CROSS-REFERENCE TO RELATED APPLICATION

The present application claims priority to U.S. Provisional Patent Application No. 61/426,176, filed Dec. 22, 2010, and incorporated herein in its entirety.

FIELD

Embodiments of the present invention may relate to an architecture of a configurable logic block (CLB) that may be used, e.g., in a semiconductor device.

BACKGROUND

A configurable logic block (CLB) may be an element of field-programmable gate array (FPGA), structured application-specific integrated circuit (ASIC) devices, and/or other devices. CLBs may be configured, for example, to implement different logic cells (combinational, such as NANDs, NORs, or inverters, and/or sequential. such as flip-flops or latches).

BRIEF DESCRIPTION OF ACCOMPANYING DRAWINGS

Various embodiments of the invention will now be discussed in further detail in conjunction with the attached drawings, in which.

DESCRIPTION OF EMBODIMENTS OF THE INVENTION

In particular, various embodiments of the present invention may provide devices that may include a via-configurable logic block (VCLB) architecture. VCLB configuration may be performed by changing properties of so called "configurable vias" —connections between VCLB internal nodes. A programmable via may be in one of two possible states: it may be either enabled or disabled. If a programmable via is enabled, then it can conduct a signal (i.e., the via exists and has low resistance). If a via is disabled, then it cannot practically conduct a signal (i.e., the via has very high resistance or does not physically exist). VCLBs may used in structured ASIC devices (see eASIC® Nextreme®-2 architecture), as well as in FPGAs (see, e.g., the Actel antifuse FPGA).

There may be a number of different VCLB architectures used. One possible VCLB architecture may be based on look-up tables (LUTs) (see, e.g., the eASIC® Nextreme®-2 architecture). A second type of VCLB may be based on programmable logic arrays (PLAs) (see, e.g., "PLA-based regular structures and their synthesis" by Brayton et al.). A third type of VCLB may use serial/parallel transistor structures (see, e.g., "The Magic of a Via-Configurable Regular Fabric" by Yajun Ran and Malgorzata Marek-Sadowska; "Standard Cell Like Via-Configurable Logic Block for Structured ASICs" by Li et al.). A proposed architecture, according to various embodiments of the invention, may relate to the third VCLB type.

One may consider two or more serially connected transistors. In other words the drain of the first transistor may be connected to the source of the second transistor; the drain of the second transistor may be connected to the source of the third transistor, and so on. The drain of the first transistor and the source of the last transistor may be left hanging (i.e., unconnected). One may call this group of interconnected transistors a "transistor chain".

Figure 1:
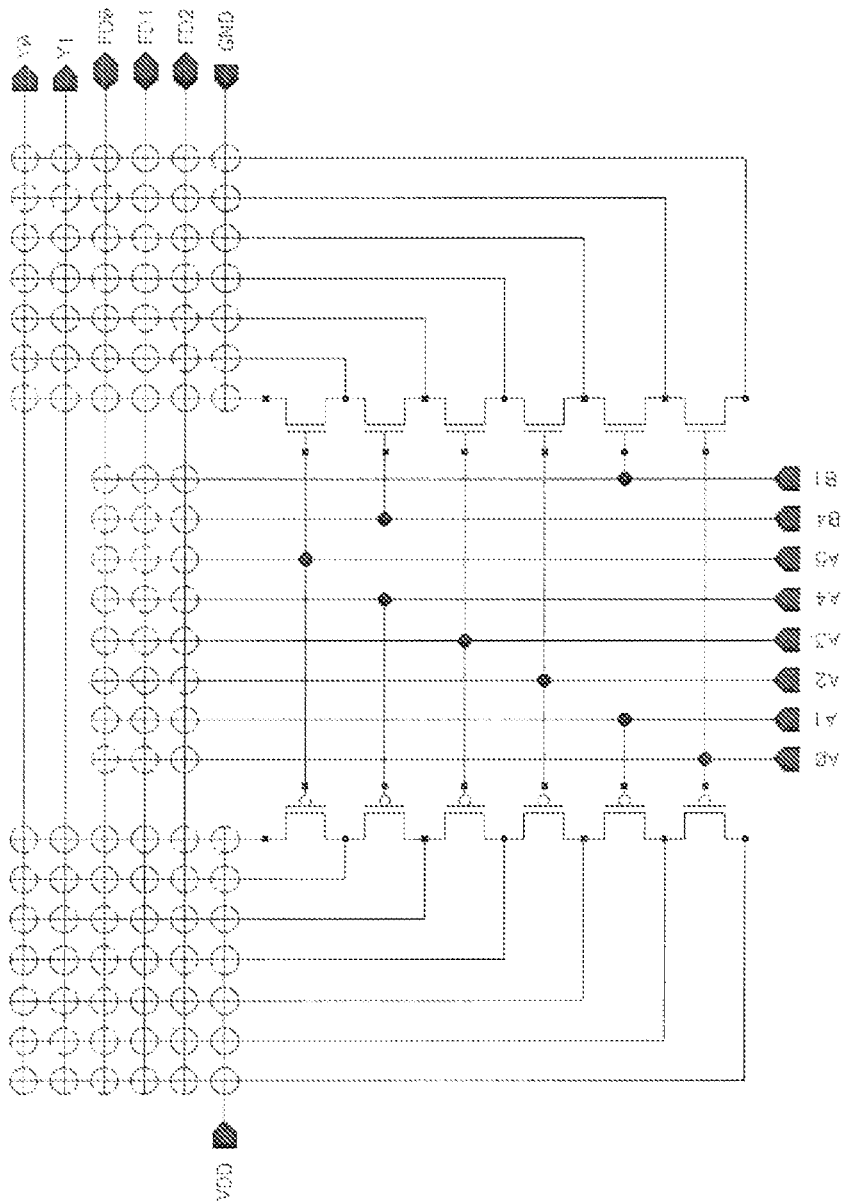
FIG. 1 shows an example of a device including a via-configurable logic block according to various embodiments of the invention.

According to an embodiment of the invention, e.g., as shown in FIG. 1, a device that may include a VCLB may include two transistor chains: a P-chain that contains P-type transistors, e.g., as shown in the left-hand side of FIG. 1, and an N-chain that contains N-type transistors, e.g., as shown in the right-hand side of FIG. 1. The P-chain and N-chain may have the same or different numbers of transistors, in various embodiments of the invention. Additionally, there may be multiple P-chains and/or N-chains, and there need not be the same number of P-chains and N-chains. All sources/drains/gates of the transistors in the chains may generally be connected to a via-configurable routing fabric. The fabric may also be connected to external ports and/or power (VDD) and/or ground lines. In FIG. 1, the via-configurable routing fabric may include configurable vias (shown as unfilled circles) located at potential connection points, e.g., among the various transistors, the VDD line, the ground line, the terminals Y0, Y1, and/or FD0-FD2, and/or the terminals A0-A5, B1, and/or B4. If there are no vias enabled in the fabric, then there are no direct connections between transistors in the chains and the various external ports and/or VDD and/or ground lines. An exception is that some (but not all) gates of transistors in P-chain may be directly connected (hardwired) to the gates of transistors in N-chain. However, it is contemplated that, according to embodiments of the invention, at least one transistor of one transistor chain (the P-chain or the N-chain) may not be directly connected (hardwired) to a transistor of the other transistor chain. It is also contemplated that various embodiments of the invention may, in the via-configurable routing fabric, include via-configurable connections between transistors of the P-chain and the N-chain (or more than one P-chain and more than one N-chain) and that these connections need not be strictly between P-type and N-type transistors arranged in parallel (e.g., opposite each other or in corresponding positions) in the P-chain(s) and N-chain(s); rather, in various embodiments of the invention, any P-type transistor of the P-chain(s) may have a via-configurable connection to any N-type transistor of the N-chain(s). In some embodiments, the via-configurable connections may be between all transistors of the P-chain(s) and all transistors of the N-chain(s), or they may permit only a subset of the transistors of either or both of the P-chain(s) and N-chain(s) to be connected to each other using via-configurable connections.

By inserting vias in the routing fabric it may be possible to establish connections between the transistors. VDD/Ground lines and/or external ports. In so doing, one may create different types of combinational and/or sequential logic blocks by means of such connections. Such logic blocks need not be limited to a single logic function, such as NAND or NOR, but may include multiple logic functions in a single block. So, too, combination and/or sequential logic functions may be implemented.

While the via-configurable connection fabric may be implemented so as to form configurable connections between metal layers 1 and 2 (M1 and M2) of a multi-layer circuit architecture, the invention is not thus limited. It is contemplated that, according various embodiments of the invention, configurable vias may be established to permit connections involving one or more metal layers higher than M2 (e.g., M3 and above), or which may be implemented at one or more of such higher metal layers.

Figure 2:
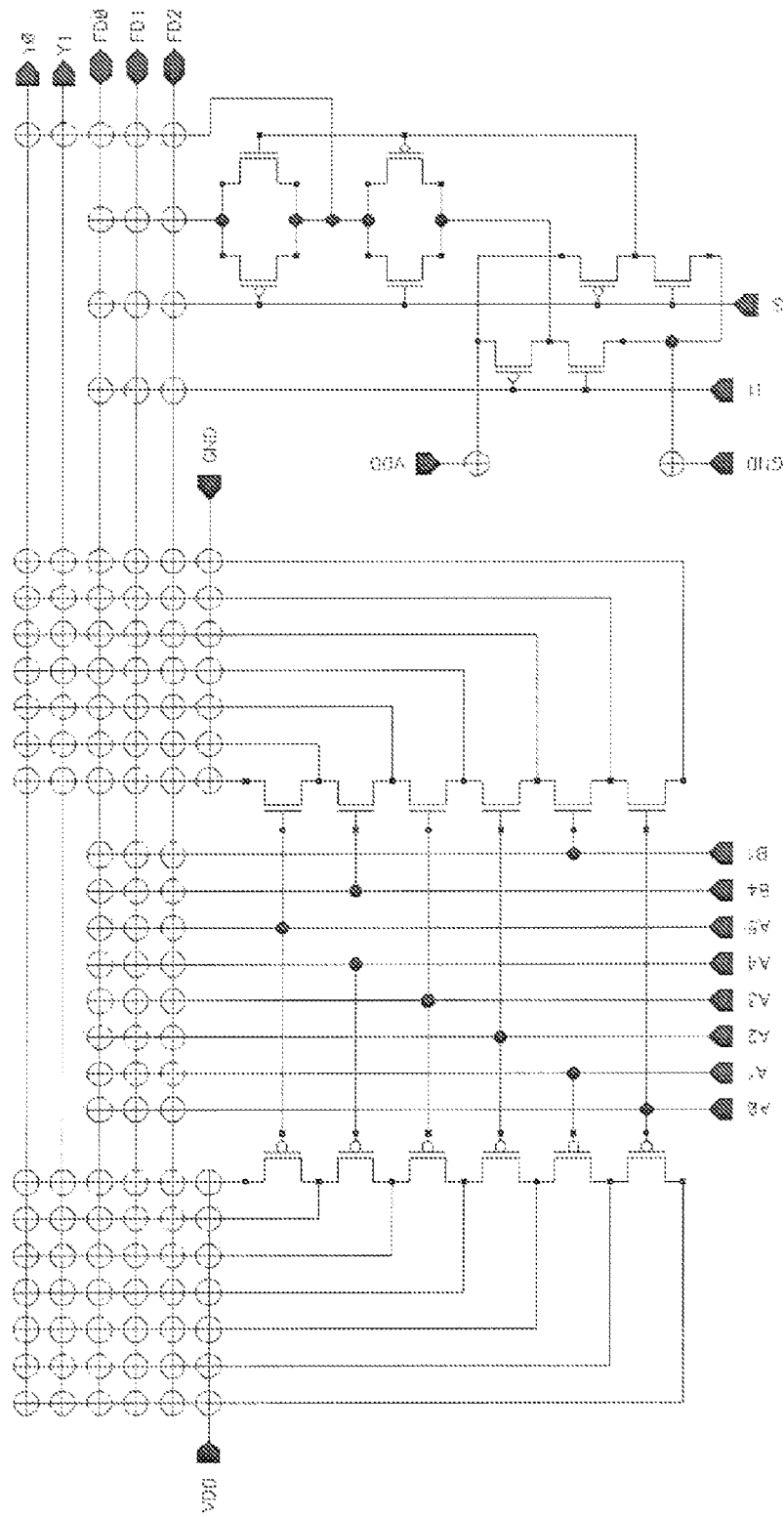
FIG. 2 shows a further example of a device including a via-configurable logic block according to various embodiments of the invention.

FIG. 2 shows a further example of a device, similar to that shown in FIG. 1, but with further circuitry connected. A VCLB similar (but not identical to) that of FIG. 1 is shown in the left-hand two-thirds of FIG. 2, while additional circuitry is shown in the right-hand third of FIG. 2. Again, various terminals and/or lines (Y0, Y1, FD0-FD2, A0-A5. B1, B4, I1, S) may or may not be connected to one another and/or to VDD and/or ground lines and/or to various transistors of the P-chain(s) and/or N-chain(s) by means of a via-configurable routing fabric, as shown. As such, a device may incorporate a VCLB architecture that may be integrated with other types of circuitry to provide various functionalities.

Figure 3:
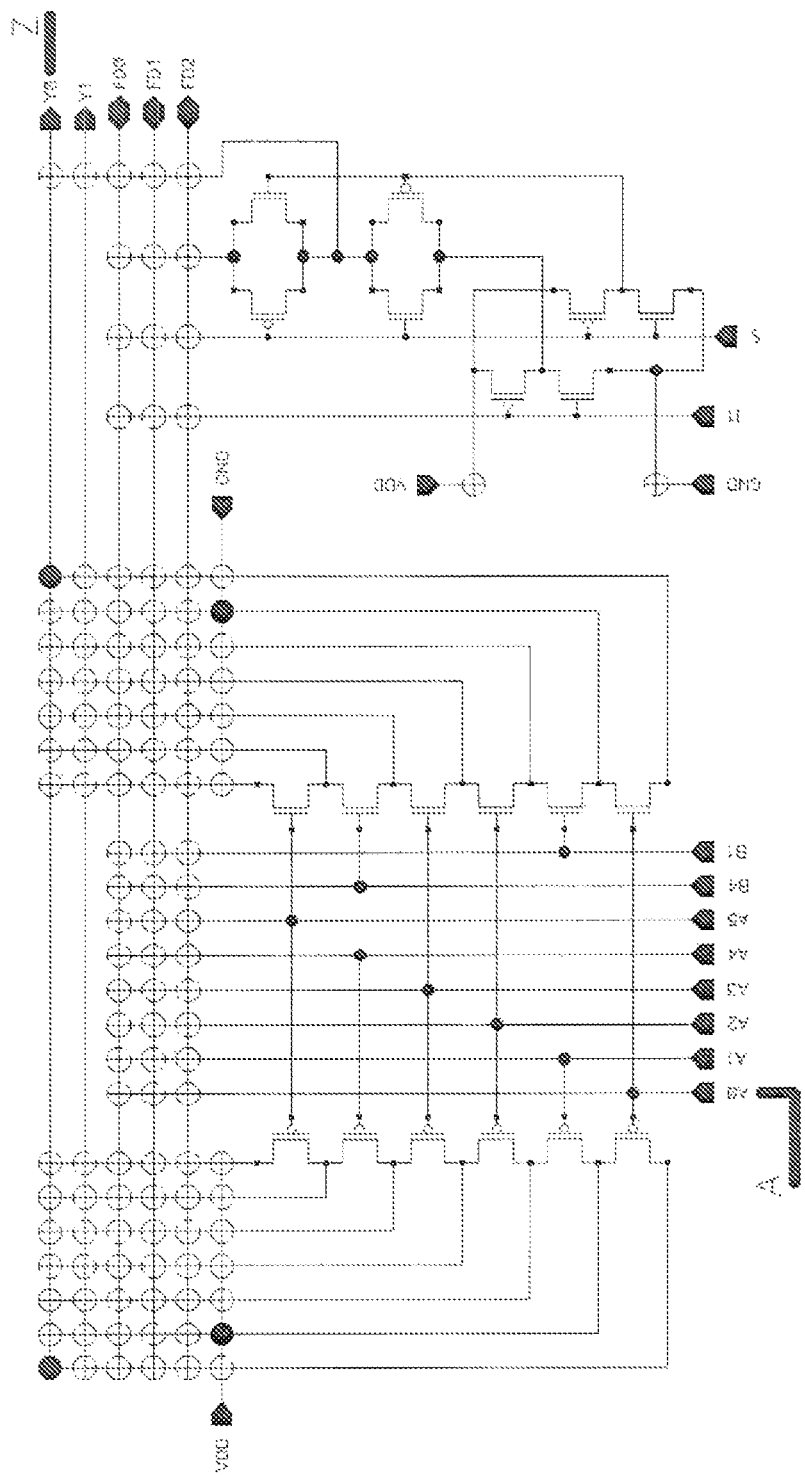
FIGS. 3-5 show various examples of how the exemplary via-configurable logic block of FIG. 2 may be configured to perform various functions in various devices, according to various embodiments of the invention.
Figure 4:
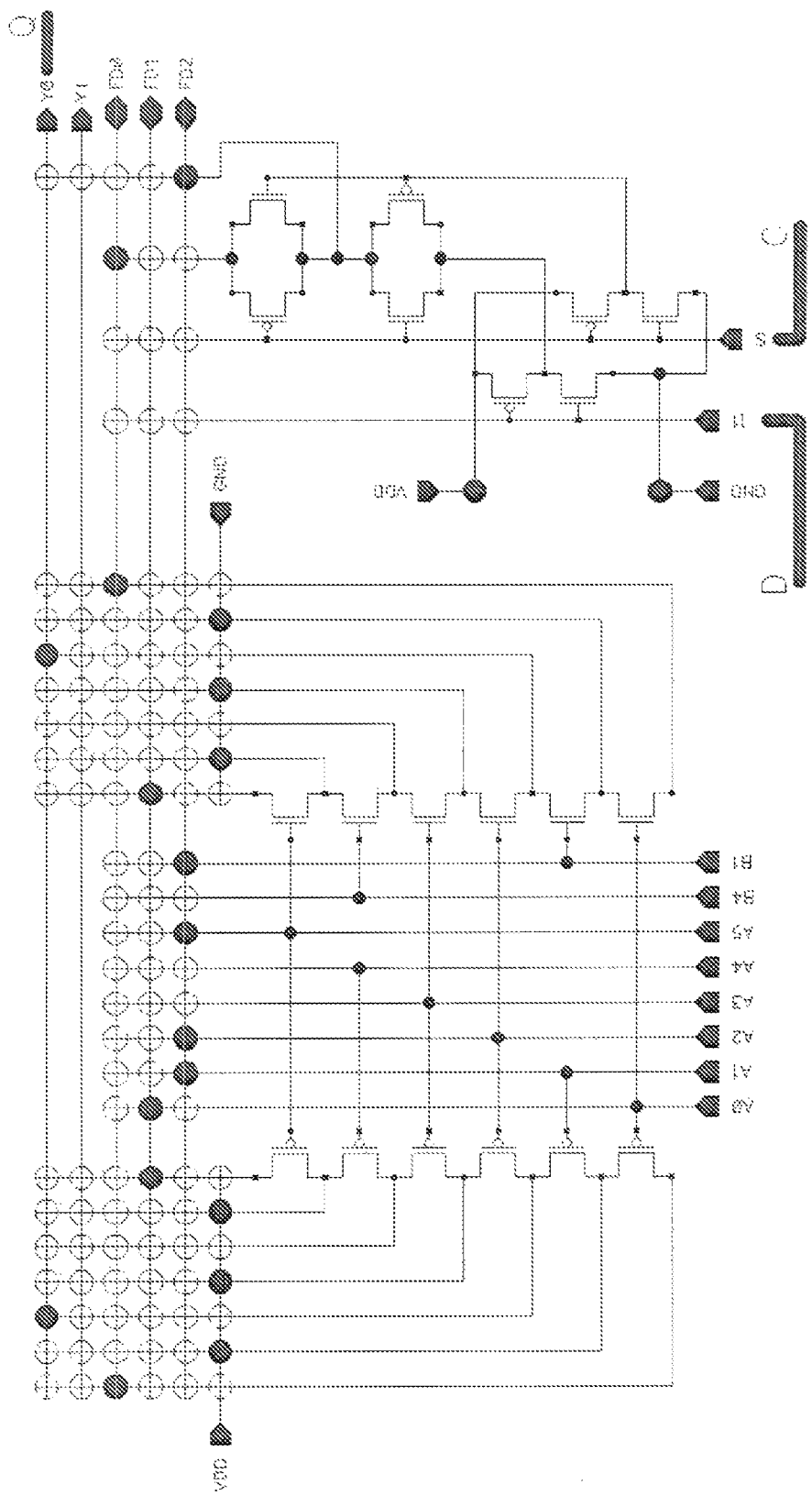
Figure 5:
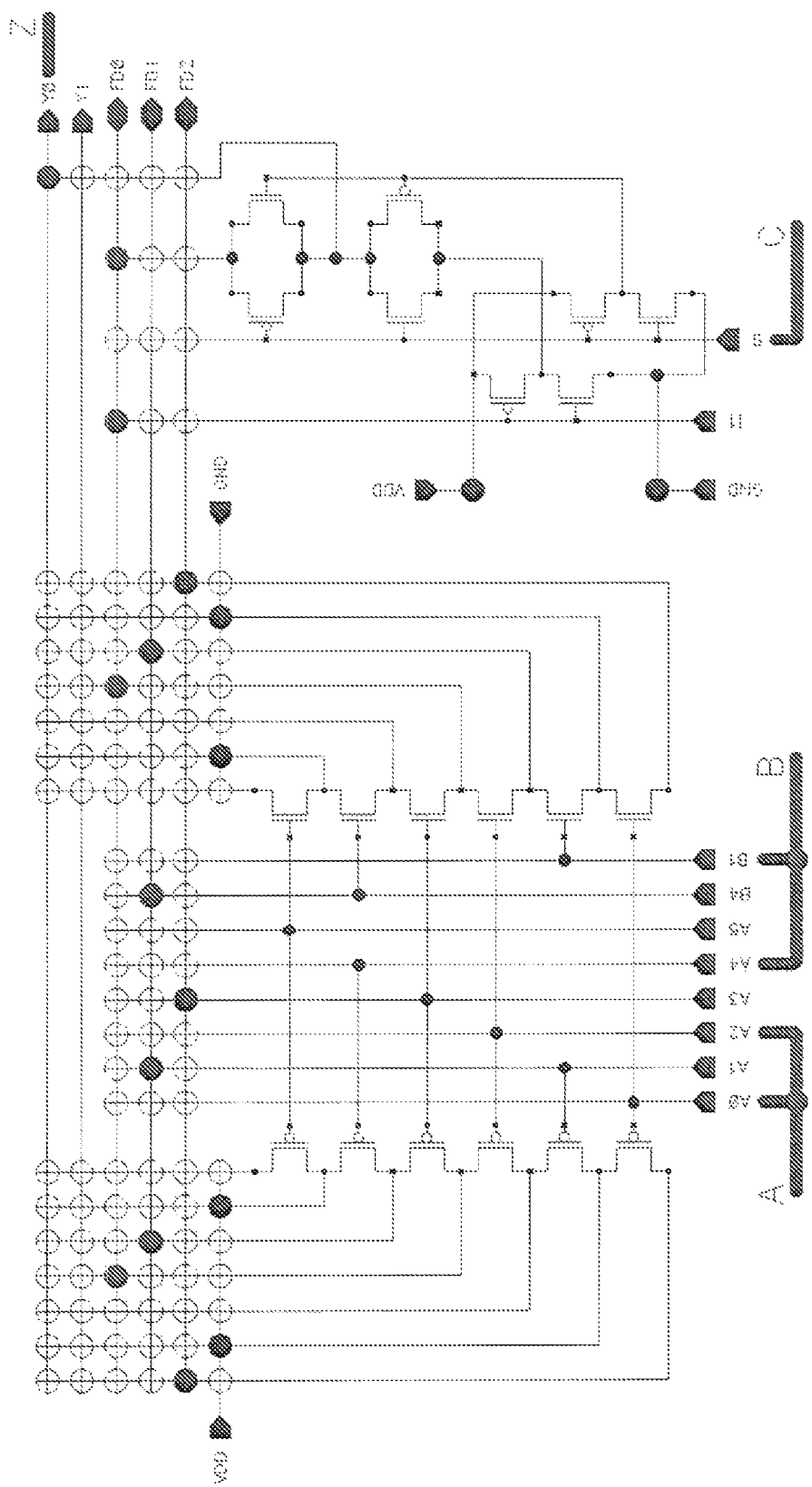

FIGS. 3-5 show various exemplary implementations of various logic functions that may be implemented by devices incorporating a VCLB. In FIGS. 3-5, conductive vias (i.e., those that have been actually configured to connect various points) are shown as large black dots.

In FIG. 3, an input, A, may be provided to the gates of the bottom transistors of the P-chain and N-chain on line A0. The conductive vias in FIG. 3 show the relevant transistor of the P-chain with one terminal connected to VDD and one terminal connected to Y0, from which an output ("Z") may be provided. The conductive vias in FIG. 3 show the relevant transistor of the N-chain with one terminal connected to ground and one terminal connected, also, to Y0. In this configuration, the device may implement an inverter.

In FIG. 4, the various conductive vias may make various connections that may be used to permit the device to implement an active-high transparent latch. In FIG. 4, D (fed to line I1) is the input, C (fed to line S) is the clock, and Q (at terminal Y0) is the output.

In FIG. 5, the various conductive vias may make various connections that may be used to permit the device to implement a three-input exclusive-OR (XOR) gate. The inputs are shown as A, B, and C, and the output is shown as Z. Input A may be fed to lines A0 and A2, input B may be fed to lines A4 and B1, and input C may be fed to line S. The output, Z=A⊕B⊕C, may be obtained at terminal Y0.

In various embodiments of the invention, the via-configurable routing fabric may include programmable vias. These may be of particular use in designs having the via-configurable routing fabric in or between higher metal layers (as discussed above), and which may be used to permit a user to program functionality of the device. Such programmable vias may be constructed of various types of materials, such as, but not limited to, fuses, anti-fuses, and/or phase-change materials (e.g., but not limited to, graphene) and/or by one or micro- or nano-electromechanical system (MEMS/NEMS) devices. Such programmable vias may be programmed by various means, for example, but not limited to, heat, application of electric current, and/or application of light (e.g., lasers). A more detailed discussion of programmable vias may be found, e.g., in co-pending U.S. patent application Ser. No. 12/046,626, entitled, "Programmable Vias for Structured ASICs," filed on Mar. 12, 2008, and U.S. patent application Ser. No. 12/562,812, entitled, "MEMS-Based Switching," filed on Sep. 18, 2009, both of which are assigned to the assignee of this application. and which are incorporated herein by reference.

An architecture such as that described above may help to overcome some of the disadvantages of prior configurable logic architectures. Some of these improvements may relate to chip area, timing functions, and/or flexibility. Since some transistor gates are not hardwired, more complex logic functions (MUX21, XOR2, etc.) may be implemented by a single device incorporating a VCLB. That means that there may be no need to introduce multiple such device types, which may help to improve overall logic density and routability.

Various embodiments of the invention have been presented above. However, the invention is not intended to be limited to the specific embodiments presented, which have been presented for purposes of illustration. Rather, the invention extends to functional equivalents as would be within the scope of the appended claims. Those skilled in the art, having the benefit of the teachings of this specification, may make numerous modifications without departing from the scope and spirit of the invention in its various aspects.

What is claimed is:

1. A semiconductor device comprising:
    a chain of serially connected P-type transistors, including only P-type transistors as transistors in the chain;
    a chain of serially connected N-type transistors, including only N-type transistors as transistors in the chain;
    power and ground lines; and
    via-configurable interconnections among the transistors and at least one of the power line or ground line, wherein the via-configurable interconnections are formed by programmable vias,
    wherein at least one P-type transistor of the chain of P-type transistors has a gate that is not hardwired to a gate of an N-type transistor of the chain of N-type transistors or at least one N-type transistor of the chain of N-type transistors has a gate that is not hardwired to a P-type transistor of the chain of P-type transistors.

2. The semiconductor device according to claim 1, wherein one or more vias are implemented by using one or more via layers configured to form connections between two or more metal layers of a layered circuit design.

3. The semiconductor device according to claim 1, wherein one or more vias are implemented as fuses or anti-fuses.

4. The semiconductor device according to claim 1, wherein one or more vias are implemented by using at least one phase-change material.

5. The semiconductor device according to claim 4, wherein the at least one phase-change material comprises grapheme.

6. The semiconductor device according to claim 1, wherein one or more vias are implemented by using one or more micro-electromechanical system (MEMS) and/or nano-electromechanical system (NEMS) devices.

7. The semiconductor device according to claim 1, wherein the semiconductor device comprises further circuitry configured to be connected to via-configurable circuitry including the chain of serially-connected P-type transistors and the chain of serially-connected N-type transistors using one or more via-configurable interconnections.

8. The semiconductor device according to claim 7, wherein the further circuitry includes one or more via-configurable connections to power and/or ground lines.

9. The semiconductor device according to claim 1, wherein the via-configurable connections include connections between one or more P-type transistors of the chain of P-type transistors and one or more N-type transistors of the chain of N-type transistors that are not arranged opposite each other or in corresponding positions within the respective chains of P-type and N-type transistors.

10. The semiconductor device according to claim 1, wherein the chain of P-type transistors Contains a different number of P-type transistors from a number of N-type transistors in the chain of N-type transistors.

11. The semiconductor device according to claim 1, further comprising at least one further chain of serially connected P-type transistors or at least one further chain of serially connected N-type transistors.

12. The semiconductor device according to claim 1, further comprising one or more terminals, configured to provide at least one connection external to the semiconductor device, and configured to be connected to at least one of the P-type transistors, at least one of the N-type transistors, the power line and/or the ground line by means of at least one via-configurable connection.

13. The semiconductor device according to claim 1, wherein respective transistors of the chain of serially connected P-type transistors and the chain of serially connected N-type transistors include respective sources and drains that are configured to be interconnected to the power line, the ground line, one or more external connection lines, or one or more gates of transistors of the chains of serially connected P-type transistors or serially connected N-type transistors using one or more programmable vias.

14. The semiconductor device according to claim 1, wherein respective end transistors of the chain of serially connected P-type transistors and the chain of serially connected N-type transistors have a source or drain that is left initially unconnected, and which is configured to be connected to the power line, the ground line, one or more external connection lines, or one or more gates of transistors of the chains of serially connected P-type transistors or serially connected N-type transistors using a programmable via.

* * * * *